(12) United States Patent
Wei et al.

(10) Patent No.: US 9,647,172 B2
(45) Date of Patent: May 9, 2017

(54) LIGHT EMITTING DEVICE

(71) Applicant: EPISTAR CORPORATION, Hsinchu (TW)

(72) Inventors: Chih-Hao Wei, Hsinchu (TW); Yi-Luen Huang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/826,495

(22) Filed: Aug. 14, 2015

(65) Prior Publication Data

US 2015/0349229 A1    Dec. 3, 2015

Related U.S. Application Data

(63) Continuation-in-part of application No. 14/175,820, filed on Feb. 7, 2014, now abandoned.

(51) Int. Cl.
| | | |
|---|---|---|
| H01L 33/00 | (2010.01) | |
| H01L 33/02 | (2010.01) | |
| H01L 33/22 | (2010.01) | |
| H01L 33/42 | (2010.01) | |

(52) U.S. Cl.
CPC ............ H01L 33/025 (2013.01); H01L 33/22 (2013.01); H01L 33/42 (2013.01); *H01L 2933/0016* (2013.01)

(58) Field of Classification Search
CPC ........ H01L 33/025; H01L 33/22; H01L 33/42
See application file for complete search history.

(56) References Cited

U.S. PATENT DOCUMENTS

| | | | | |
|---|---|---|---|---|
| 6,469,324 B1* | 10/2002 | Wang | .................... | H01L 33/405 |
| | | | | 257/79 |
| 8,183,575 B2* | 5/2012 | Farmer | .................... | H01L 33/42 |
| | | | | 257/79 |
| 9,337,366 B2* | 5/2016 | Xu | .................... | H01L 31/02168 |
| 2007/0018183 A1* | 1/2007 | Denbaars | ................ | H01L 33/42 |
| | | | | 257/98 |
| 2008/0006842 A1* | 1/2008 | Seong | ..................... | H01L 33/22 |
| | | | | 257/99 |
| 2012/0061642 A1* | 3/2012 | Tanaka | .................... | H01L 33/42 |
| | | | | 257/13 |

OTHER PUBLICATIONS

Shyi-Ming Pan, Ru-Chin Tu ; Yu-Mei Fan ; R. -C. Yeh ; Jung-Tsung Hsu, Improvement of InGaN-GaN light-emitting diodes with surface-textured indium-tin-oxide transparent ohmic contacts, IEEE Photonics Technology Letters (vol. 15, Issue: 5), 649-651, May 2003.*

* cited by examiner

*Primary Examiner* — Mark Tornow
(74) *Attorney, Agent, or Firm* — Ditthavong & Steiner, P.C.

(57) ABSTRACT

A light-emitting diode comprises a substrate; a semiconductor stack on the substrate, wherein the semiconductor stack comprises a first semiconductor layer, an active layer for emitting a light, and a second semiconductor layer; a first oxide layer on the semiconductor stack, wherein the first oxide layer has a top surface opposite to the semiconductor stack, and the top surface comprises a first region and a second region; and a first pad on the second region; wherein the first region is rougher than the second region, wherein the first oxide layer comprises an impurity, and a concentration of the impurity of the first oxide layer in the first region is higher than that of the impurity of the first oxide layer in the second region.

16 Claims, 9 Drawing Sheets

LIGHT EMITTING DEVICE

REFERENCE TO RELATED APPLICATION

This application is a continued in part of U.S. patent application Ser. No. 14/175,820, filed Feb. 7, 2014, and the content of which is hereby incorporated by reference in its entirety.

TECHNICAL FIELD

The present application relates to a method of manufacturing a light-emitting device with a rough surface to improve the reliability thereof.

DESCRIPTION OF BACKGROUND ART

Generally, the top surface of a light-emitting diode is roughened to reduce total reflection and improve the light extraction efficiency. The process of roughening the top surface includes dry etching and wet etching. Dry etching could control the roughening region precisely, but the cost is higher. The cost of wet etching is lower, but the top surface under the bonding pad is usually laterally etched during the process of wet etching and causes the peeling of the bonding pad easily.

As FIG. 1 shows, a light-emitting diode 1 comprises a substrate 8, a first semiconductor layer 12 having a first polarity, such as a n-type GaN layer, on the substrate 8, an active layer 10 for emitting light on the first semiconductor layer 12, a second semiconductor layer 11 having a second polarity, such as a p-type GaN layer, on the active layer 10, a conductive oxide layer 2 on the second semiconductor layer 11, and a second pad 9 is formed on the side of the substrate 8 opposite to the first semiconductor layer 12, wherein the conductive oxide layer 2 has a rough top surface 21 and a bonding pad 3 is formed on the top surface 21. When a portion of the top surface 21 under the bonding pad 3 is etched, the adhesion between top surface 21 and the bonding pad 3 decreased, and the bonding pad 3 is peeled easily from the top surface 21.

SUMMARY OF THE DISCLOSURE

A light-emitting diode comprises a substrate; a semiconductor stack on the substrate, wherein the semiconductor stack comprises a first semiconductor layer, an active layer for emitting a light, and a second semiconductor layer; a first oxide layer on the semiconductor stack, wherein the first oxide layer has a top surface opposite to the semiconductor stack, and the top surface comprises a first region and a second region; and a first pad on the second region; wherein the first region is rougher than the second region, wherein the first oxide layer comprises an impurity, and a concentration of the impurity of the first oxide layer in the first region is higher than that of the impurity of the first oxide layer in the second region.

DETAILED DESCRIPTION OF PREFERRED EMBODIMENTS

Figure 1:
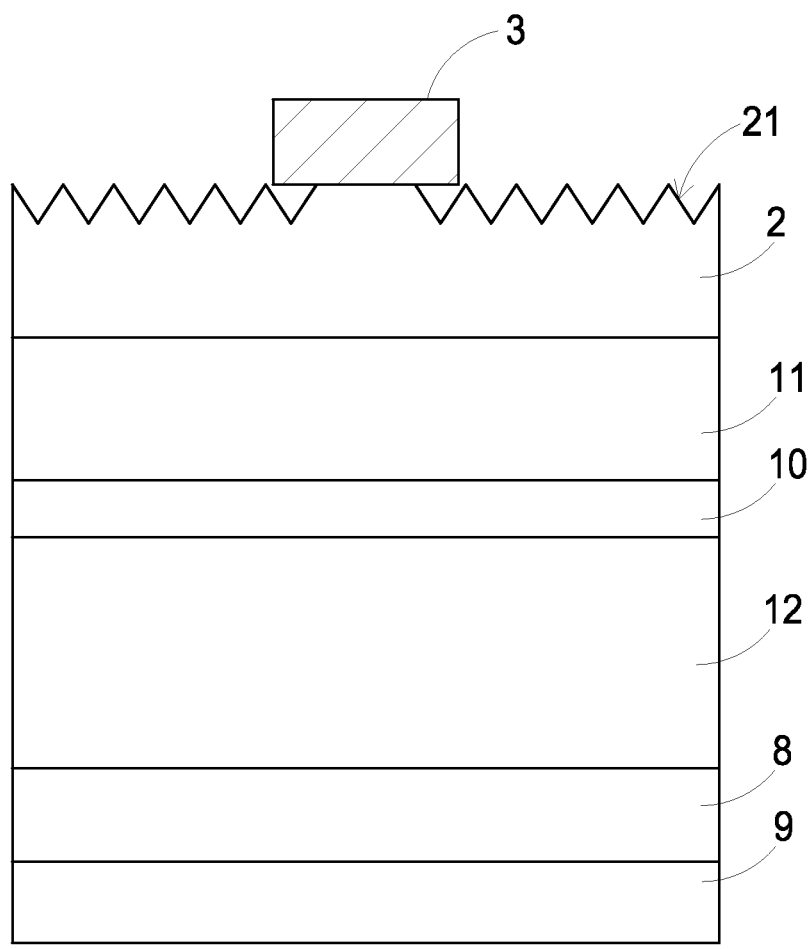
FIG. 1 shows a light-emitting device according to prior art.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

First Embodiment

Figure 2A:
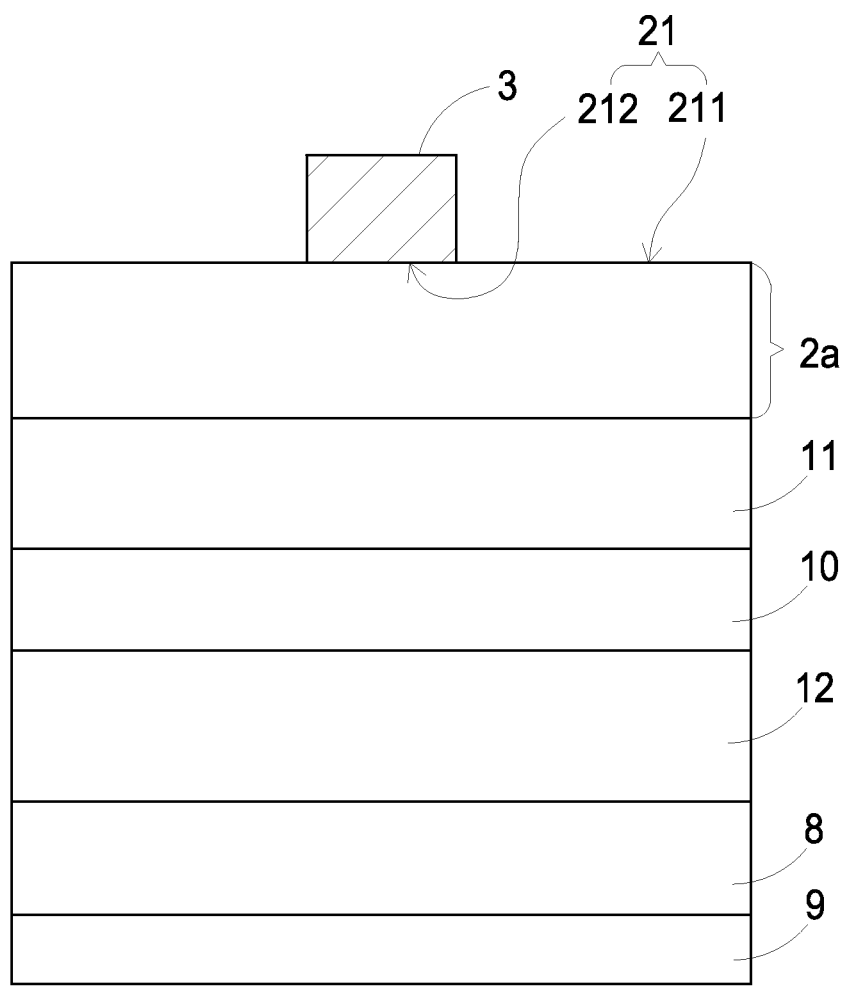
FIGS. 2A to 2F show a method of roughening an oxide layer of a light-emitting device according to first embodiment.

FIGS. 2A to 2F show a method of roughening an oxide layer of a vertical type light-emitting device. FIG. 2A shows the step of providing a vertical type light-emitting device 100. The light-emitting device 100 comprises a substrate 8, a first semiconductor layer 12 having a first polarity, such as an n-type GaN layer, on the substrate 8, an active layer 10 which can be a single heterostructure (SH) structure, a double heterostructure (DH) structure, a double-side double heterostructure (DDH) structure, or a multi-quantum well (MWQ) structure on the first semiconductor layer 12, a second semiconductor layer 11 having a second polarity, such as a p-type GaN layer, on the active layer 10, a first oxide layer 2a, such as indium tin oxide (ITO), on the second semiconductor layer 11. The first oxide layer 2a has a top surface 21, wherein the top surface 21 has a first region 211 and a second region 212, and a first pad is formed on the second region 212 and ohmically contacts with the first oxide layer 2a. A second pad 9 is formed on the side of the substrate 8 opposite to the first semiconductor layer 12, wherein the substrate 8 is electrically conductive and comprises a conductive material, such as metal, e.g. Cu, Al, In, Sn, Zn, W or the combination thereof, or semiconductor, e.g. Si, SiC, GaN, GaAs, etc.

The materials of the first semiconductor layer 12, the active layer 10, and the second semiconductor layer 11 comprise group III-V compound semiconductor, such as gallium phosphide (GaP), gallium arsenide (GaAs), or gallium nitride (GaN). The first semiconductor layer 12, the second semiconductor layer 11, or the active layer 10 may be formed by a known epitaxy method such as metallic-organic chemical vapor deposition (MOCVD) method, a molecular beam epitaxy (MBE) method, or a hydride vapor phase epitaxy (HVPE) method.

The material of the first oxide layer 2a comprises transparent conductive oxide material, such as indium tin oxide (ITO), cadmium tin oxide (CTO), antimony tin oxide, indium zinc oxide (IZO), zinc aluminum oxide, zinc oxide, and zinc tin oxide. The first oxide layer 2a comprises a first impurity, wherein the first impurity comprises Sn, In, Al, Cd, or W. The first oxide layer 2a has a first transparency which depends on the concentration of the first impurity and the thickness of the first oxide layer 2a, and the concentration of the first impurity is over $1\text{E}21/\text{cm}^3$ and the first transparency is greater than 80% in the embodiment. The first oxide layer 2a is used for spreading the electrical current from the first pad 21. The first oxide layer 2a has a predetermined thickness such as smaller than 3000 angstroms and larger than 100 angstroms and can be formed by an evaporation deposition method under chamber conditions of around room temperature, $N_2$ ambient environment, and a pressure between $1\times10^{-4}$ Torr and $1\times10^{-2}$ Torr, or preferably around $5\times10^{-3}$ Torr.

The first pad 3 and the second pad 9 are used for conducting an electrical current into the light-emitting device 100. Each of the first pad 3 and the second pad 9 comprises a bonding portion (not shown) for wire bonding and a conducting portion (not shown) for ohmically contacting the first oxide layer 2a or the substrate 8. In other embodiment, the first pad 3 or the second pad 9 further comprises a mirror portion with a reflectivity larger than 90% for reflecting a light emitted from the active layer 10 or further comprises an adhesion layer for increasing the adhesion between the first pad 3 and the first oxide layer 2a or between the second pad 9 and the substrate 8.

Figure 2B:
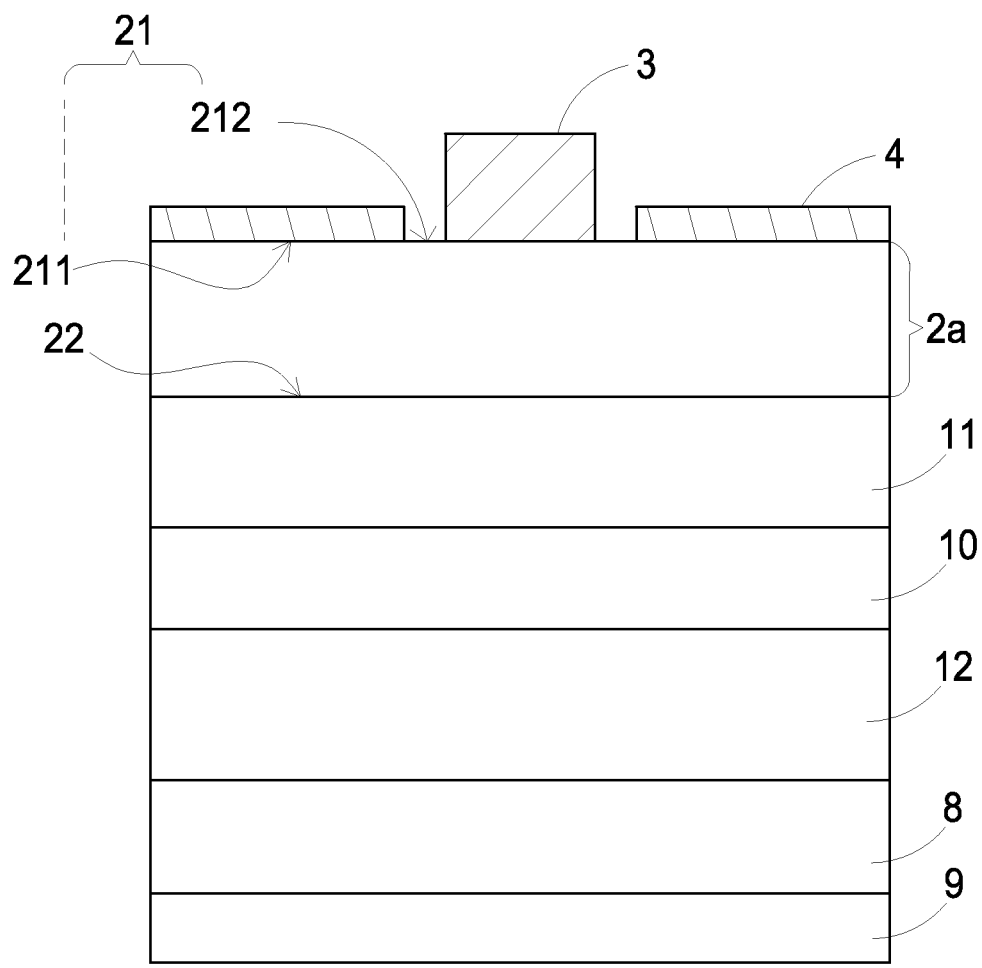

FIGS. 2B to 2E show a process of roughening a pattern region of the top surface 21 without damaging the first pad 3. FIG. 2B shows the step of forming a patterned metal layer 4 for covering the first region 211 of the top surface 21 and revealing the first pad 3 and a portion of the second region 212 where is not covered by the first pad 3. The pattern of the patterned metal layer 4 can be mesh or dot matrix. FIGS. 3A to 3C show the top view of the patterned metal layer 4 covering the first region 211 of the top surface 21. FIG. 3B shows the pattern of the patterned metal layer 4 can be dot matrix, and FIG. 3C shows the pattern of the patterned metal layer 4 can be mesh. The material of the patterned metal layer 4 comprises metal with high reactivity, such as Al or Ag.

Figure 2C:
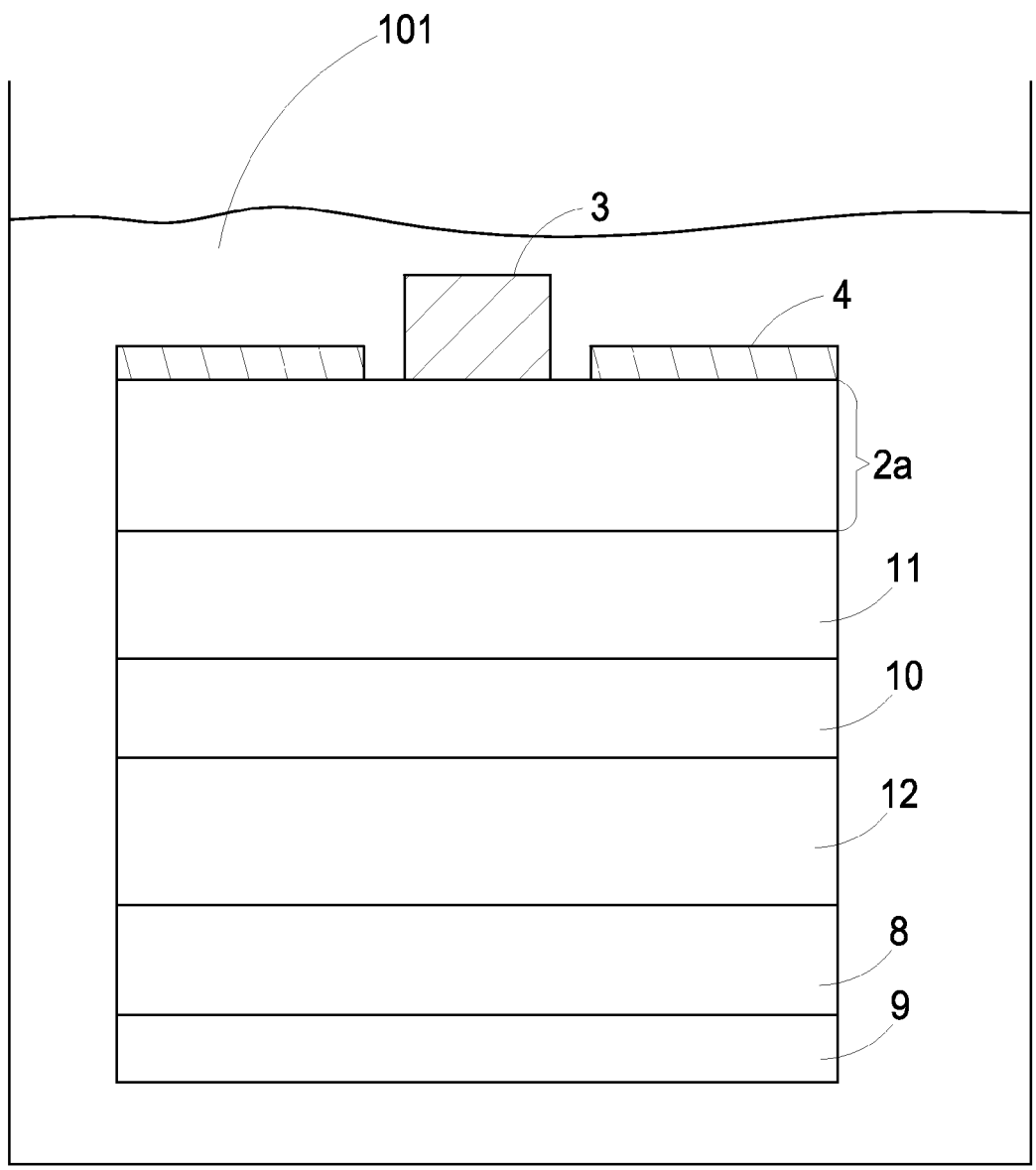
Figure 2D:
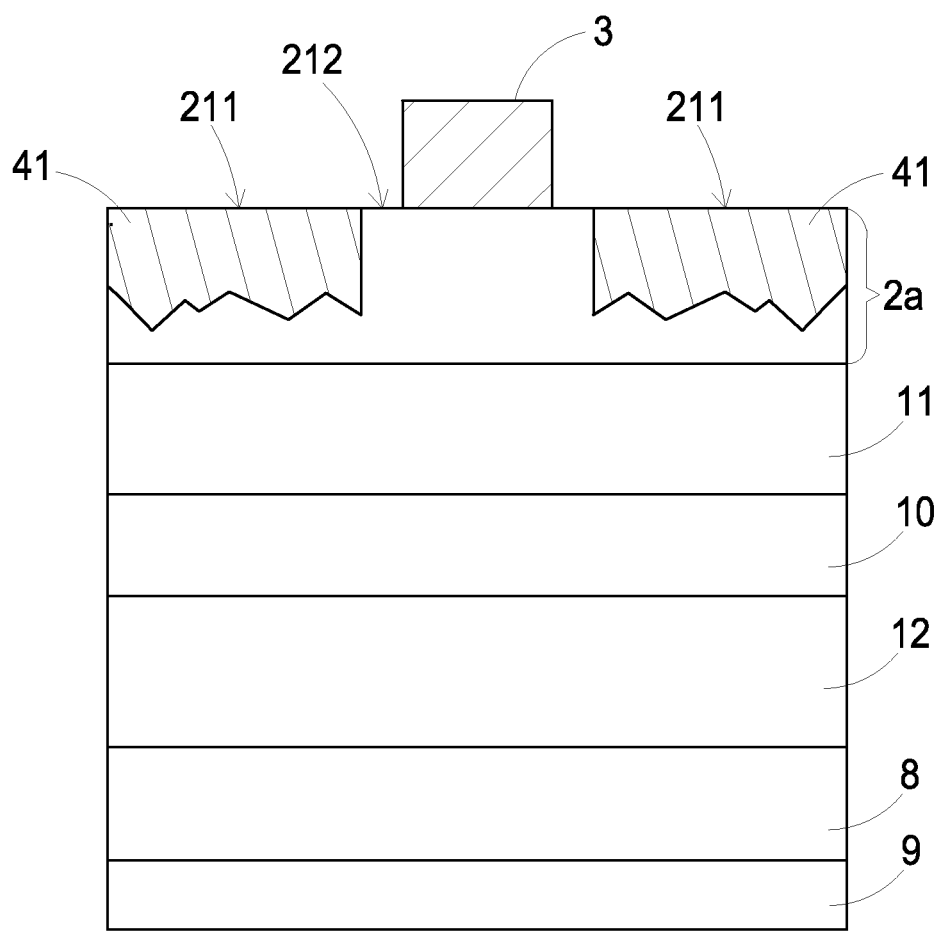
Figure 3A:
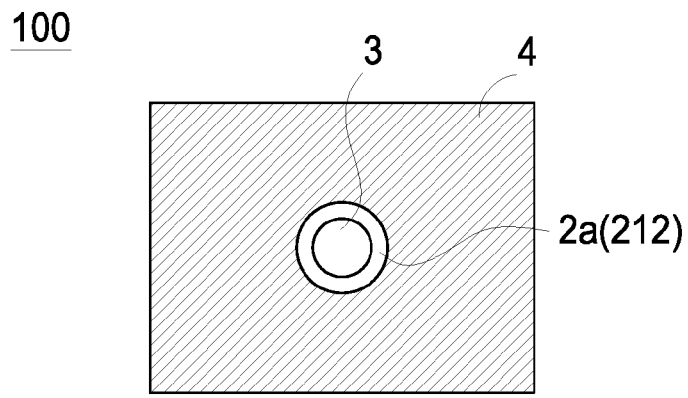
FIGS. 3A to 3C show the top view of the patterned metal layer.
Figure 3B:
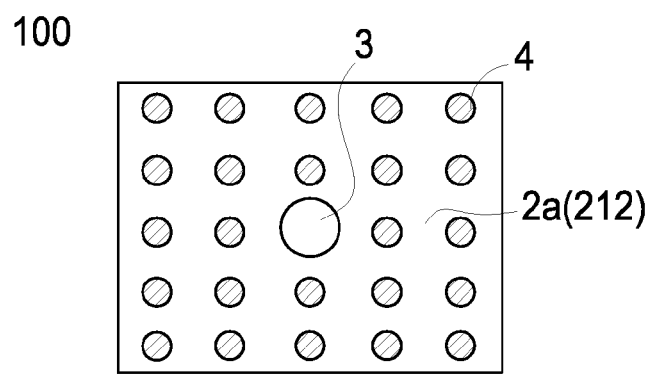
Figure 3C:
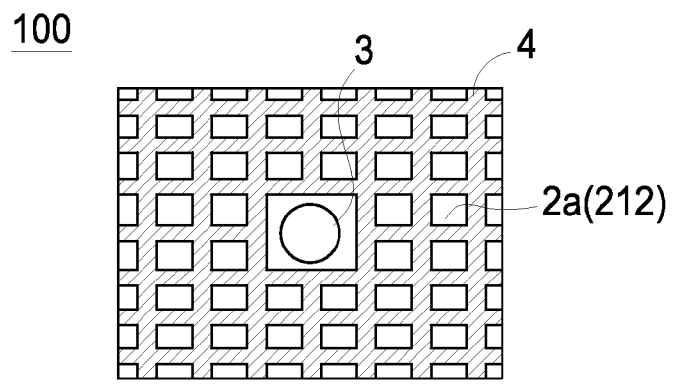

FIG. 2C shows the step of providing a first solution 101 and immersing the light-emitting device 100 in the first solution 101. The first solution 101 triggers a chemical reaction of the patterned metal layer 4 and the first oxide layer 2a, such as reduction-oxidation reaction, to dope a second impurity into the first oxide layer 2a to form a second layer 41 under the first region 211 of the top surface 21, wherein the second layer 41 forms a part of the first oxide layer 2a as shown in FIG. 2D. The material of second impurity is generated from the patterned metal layer 4, so the second impurity comprises an element the same as the patterned metal layer 4, e.g. Al or Ag. In one embodiment, the second impurity in the second layer 41 comprises an oxide material, such as $AlO_x$. In another embodiment, the first impurity of the first oxide layer 2a can be completely or partially replaced by the second impurity during the chemical reaction to form the second layer 41, wherein the concentration of the second impurity in the second layer 41 is larger than $1E21/cm^3$. The second layer 41 has a second transparency smaller than the first transparency, and generally the second layer 41 can be opaque. The first solution 101 does not react with the first oxide layer 2a without the presence of the material of the patterned metal layer 4, so the first oxide layer 2a not covered by the patterned metal layer 4 does not react with the first solution 101 and therefore is devoid of the second impurity. The first solution 101 comprises $H_2O$ and an organic base solution, such as AZ300T, wherein material of the organic base solution comprises a glycol, alkaline material or a nitrogenous organic compound. The reaction time or the thickness of the patterned metal layer 4 can determine the roughness of the first region 211 of the top surface 21. If the reaction time is longer, the first region 211 of the top surface 21 is rougher. If the patterned metal layer 4 is thicker, the first region 211 of the top surface 21 can also be rougher. That is, the roughness of the first region 211 of the top surface 21 increases with increasing the thickness of the patterned metal layer 4. For example, when the thickness of the first oxide layer 2a is 3000 Å, the thickness of the patterned metal layer 4 is smaller than 1 μm and preferably is between 200 Å and 300 Å, the roughness of the first region 211 of the top surface 21 can be controlled by the reacting time, wherein the reaction time is preferably smaller than 15 minutes to prevent from the portion of the first oxide layer 2a under the patterned metal layer 4 totally reacting with the patterned metal layer 4. Preferably, the first oxide layer 2a under the first region 211 and adjacent to the second semiconductor layer 11 is devoid of the second impurity.

Figure 2E:
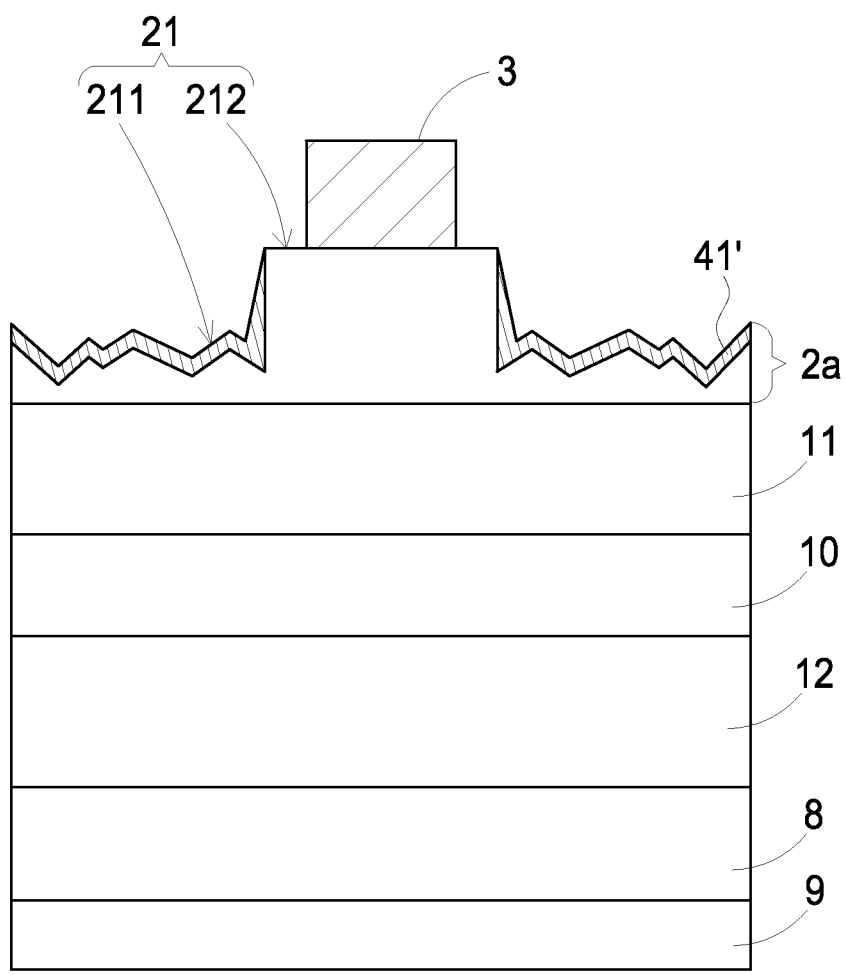

FIG. 2E shows the step of removing the second layer 41 to roughen the first region 211 of the top surface 21 by using a second solution, wherein the second solution comprises buffered oxide etching solution (BOE) or phosphoric acid. The BOE is a mixture of a buffering agent, such as the mixture of ammonium fluoride ($NH_4F$) and hydrofluoric acid (HF). A portion of the second layer 41 which is not removed forms a cover layer 41' atop the first oxide layer 2a, and the upper surface of the cover layer 41' forms the first region 211 of the top surface 21, wherein the material of the cover layer 41' is the same as that of the second layer 41. In the embodiment, the concentration of the second impurity of the cover layer 41' is higher than the concentration of the second impurity of the first oxide layer 2a under the second region 212. So, the transparency of the cover layer 41' is lower than the transparency of the first oxide layer 2a under the second region 212. The first region 211 of the top surface 21 is rougher than the second region 212 of the top surface 21. The top-view pattern of the first region 211 of the top surface 21 is the same as the top-view pattern of the patterned metal layer 4 shown in FIGS. 3A to 3C.

In another embodiment, after the process of roughening the first region 211 of the top surface 21, a portion of the first oxide layer 2a under the first region 211 is removed and to expose a portion of the second semiconductor layer 11, and therefore, the lateral conduction of the electrical current in the first oxide layer 2a is decreased.

Figure 2F:
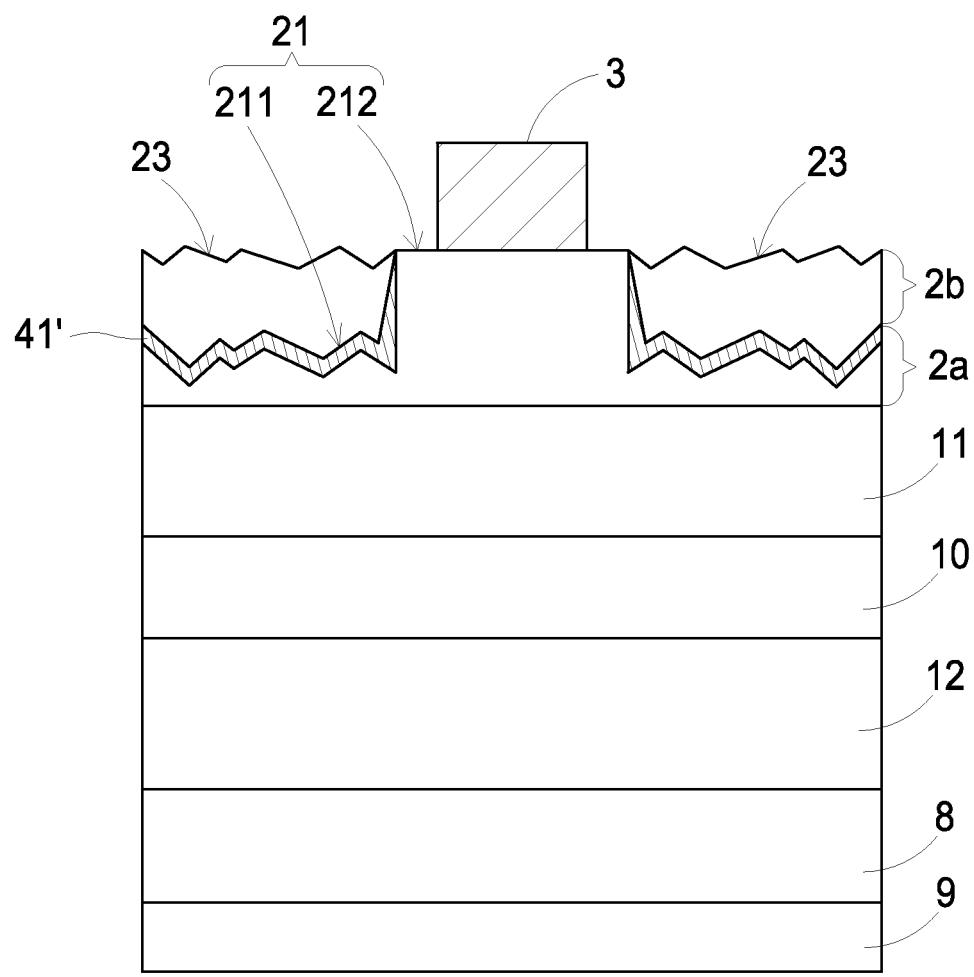
Figure 4A:
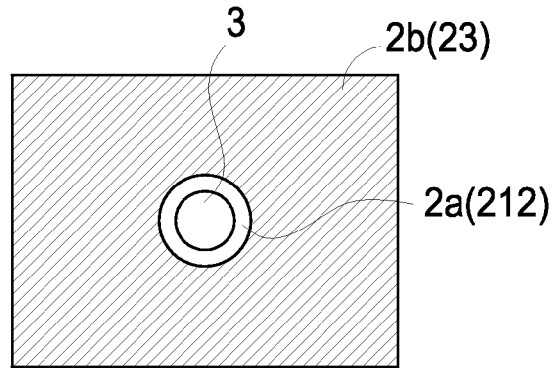
FIGS. 4A to 4C show the top view of the second oxide layer.
Figure 4B:
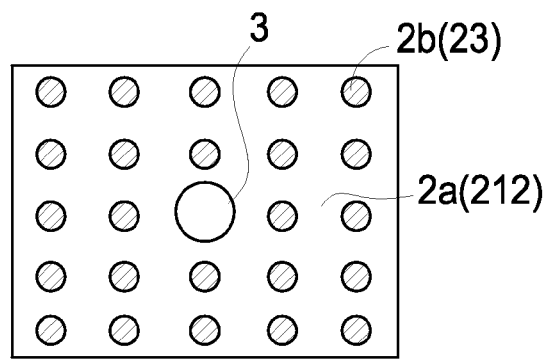
Figure 4C:
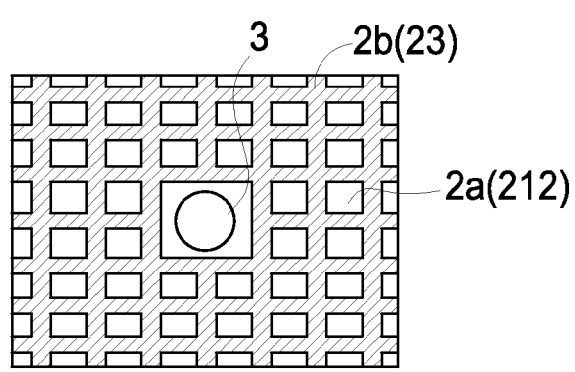

FIG. 2F shows the step of forming a second oxide layer 2b on the first region 211 of the top surface 21. The material of the second oxide layer 2b can be the same as that of the first oxide layer 2a under the second region 212. In another embodiment, the material of the second oxide layer 2b can be different from that of the first oxide layer 2a under the second region 212. The second oxide layer 2b comprises transparent conductive oxide material, such as indium tin oxide (ITO), cadmium tin oxide (CTO), antimony tin oxide, indium zinc oxide (IZO), zinc aluminum oxide, zinc oxide, and zinc tin oxide. The second oxide layer 2b is used for enhancing the lateral conduction of the electrical current in the first oxide layer 2a under the first region 211. The second oxide layer 2b comprises a second top surface 23, and the first region 211 of the top surface 21 is rougher than the second top surface 23, but the second top surface 23 is still rougher than the second region 212 of the top surface 21. FIG. 4A shows the top view of the second oxide layer 2b covering the first region 211 of the top surface 21 and without covering the second region 212 of the top surface 21 and the first pad 3. The pattern of the second oxide layer 2b is the same as the pattern of the patterned metal layer 4 showed in FIGS. 3A to 3C. In another embodiment, the pattern of the second oxide layer 2b can be mesh or dot matrix, as showed in FIGS. 4C and 4B respectively. Specifically, FIG. 4B shows the pattern of the second oxide layer 2b can be dot matrix and FIG. 4C shows the pattern of the second oxide layer 2b can be mesh.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting diode, comprising:
a substrate;
a semiconductor stack on the substrate, wherein the semiconductor stack comprises a first semiconductor layer, an active layer for emitting a light, and a second semiconductor layer;
a first oxide layer on the semiconductor stack, wherein the first oxide layer has a top surface opposite to the semiconductor stack, and the top surface comprises a first region and a second region; and
a first pad on the second region;
wherein the first region is rougher than the second region,
wherein the first oxide layer comprises an impurity, and a concentration of the impurity of the first oxide layer under the first region is higher than that of the impurity of the first oxide layer under the second region, and
wherein the first oxide layer under the second region is thicker than the first oxide layer under the first region.

2. A light-emitting diode according to claim 1, wherein the first oxide layer under the second region is devoid of the impurity.

3. A light-emitting diode according to claim 1, further comprising a second oxide layer covering the first region of the top surface.

4. A light-emitting diode according to claim 3, wherein the second oxide layer is devoid of the impurity.

5. A light-emitting diode according to claim 3, wherein the second oxide layer has a second top surface and the first region of the top surface is rougher than the second top surface.

6. A light-emitting diode according to claim 3, wherein the first oxide layer and the second oxide layer comprise the same material.

7. A light-emitting diode according to claim 3, wherein the first oxide layer and the second oxide layer comprise different material.

8. A light-emitting diode according to claim 3, wherein the first oxide layer comprises an upper portion contacting the second oxide layer and a lower portion between the upper portion and the semiconductor stack, wherein a concentration of the impurity in the upper portion is higher than that of the impurity in the lower portion.

9. A light-emitting diode according to claim 1, wherein a portion of the first oxide layer exposes the semiconductor stack.

10. A light-emitting diode according to claim 1, wherein the impurity comprises Al or Ag.

11. A light-emitting diode according to claim 1, wherein a transparency of the first oxide layer under the first region is lower than a transparency of the first oxide layer under the second region.

12. A light-emitting diode according to claim 1, wherein a pattern of the first region comprises mesh or dot matrix.

13. A light-emitting diode according to claim 1, further comprising a second pad on the substrate opposite to the semiconductor stack.

14. A light-emitting diode according to claim 1, wherein a portion of the second region is not covered by the first pad.

15. A light-emitting diode according to claim 8, wherein a transparency of the upper portion is lower than a transparency of the other portion of the first oxide layer.

16. A light-emitting diode, comprising:
a substrate;
a semiconductor stack on the substrate, wherein the semiconductor stack comprises a first semiconductor layer, an active layer for emitting a light, and a second semiconductor layer;
a first oxide layer on the semiconductor stack, wherein the first oxide layer has a top surface opposite to the semiconductor stack, and the top surface comprises a first region and a second region; and
a first pad on the second region;
wherein the first region is rougher than the second region, and
wherein the first oxide layer comprises an upper portion and a lower portion between the upper portion and the semiconductor stack, and a concentration of the impurity in the upper portion is higher than that of the impurity in the lower portion.

* * * * *